Figure 1:
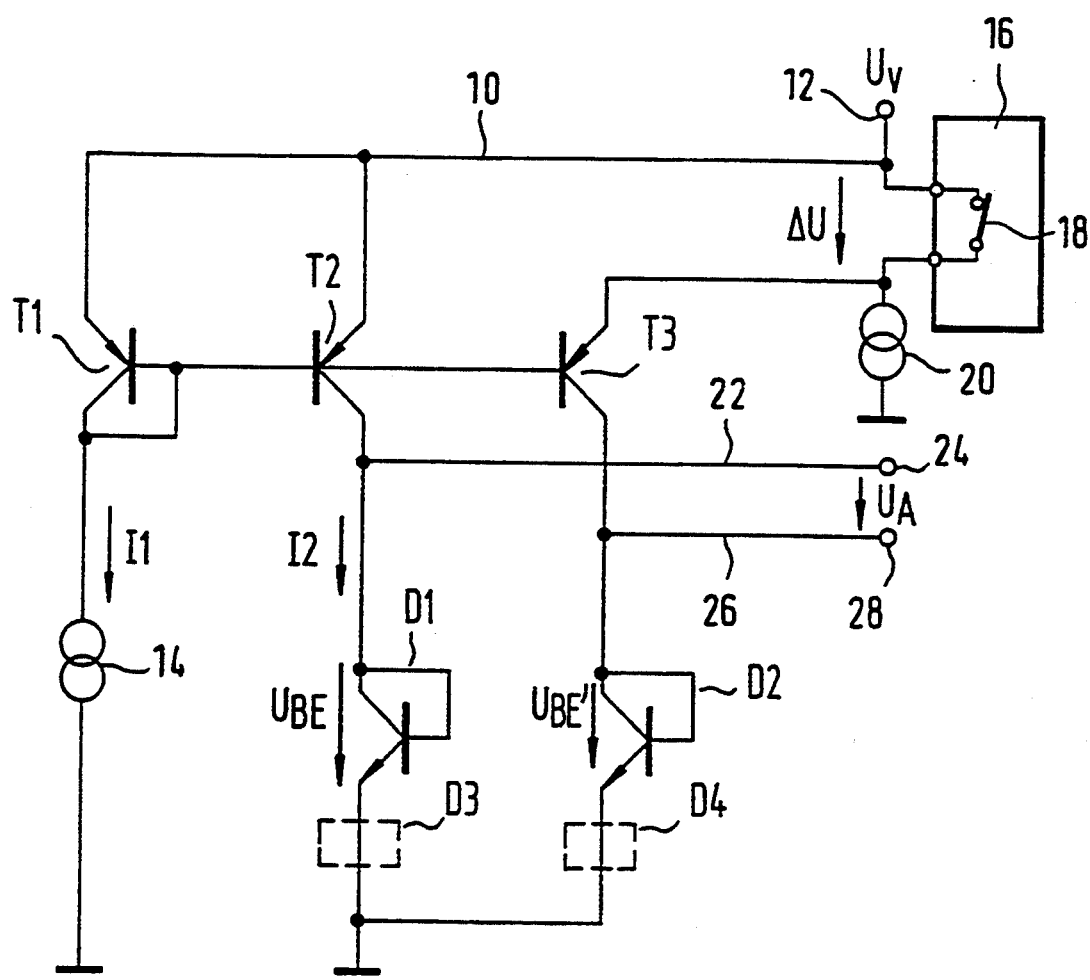

United States Patent [19]

Götz

[11] Patent Number: 5,347,174
[45] Date of Patent: Sep. 13, 1994

[54] CIRCUIT ARRANGEMENT FOR CONVERTING A VOLTAGE DROP TAPPED FROM A TEST OBJECT FROM A PREDETERMINED INPUT VOLTAGE RANGE TO A DESIRED OUTPUT VOLTAGE RANGE

[75] Inventor: Laszlo Götz, Freising, Fed. Rep. of Germany

[73] Assignee: Texas Instruments Deutschland GmbH, Freising, Fed. Rep. of Germany

[21] Appl. No.: 907,269

[22] Filed: Jul. 1, 1992

[51] Int. Cl.$^5$ .................................... H03K 17/30
[52] U.S. Cl. .................................... 307/360; 330/288; 323/315; 307/296.6
[58] Field of Search ............... 307/296.6, 350, 360, 307/355, 356, 362, 358; 330/288; 323/315

[56] References Cited

U.S. PATENT DOCUMENTS

| | | | |
|---|---|---|---|
| 4,088,905 | 5/1978 | Comer | 307/362 |
| 4,401,899 | 8/1983 | Okada | 307/350 |
| 4,513,209 | 4/1985 | Tanabe et al. | 307/350 |
| 4,553,048 | 11/1985 | Bynum et al. | 307/350 |
| 4,620,114 | 10/1986 | Moon | 307/362 |
| 4,988,895 | 1/1991 | Kihara et al. | 307/362 |

Primary Examiner—Timothy P. Callahan
Assistant Examiner—Shawn Riley
Attorney, Agent, or Firm—William E. Hiller; Richard L. Donaldson

[57] ABSTRACT

A circuit arrangement for converting a voltage drop ($\Delta U$) tapped from a test object from a predetermined input voltage range to a desired output voltage range includes a current mirror circuit fed by a constant current source (14) and comprising an input transistor (T1) and an output transistor (T2). The constant current source (14) lies in the collector line of the input transistor (T1) whilst in the collector line of the output transistor (T2) at least one diode (D1) lies which is traversed by a current having a value which is equal to the value of the current furnished by the constant current source (14). Lying in parallel with the series circuit of the output transistor (T2) and the diode (D1) is an identically configured circuit branch having a further transistor (T3) and at least one diode (D2) lying in the collector line thereof. The test object (16) lies in the emitter line of the further transistor (T3); the test object (16) is traversed by a test current from a further constant current source (20). Two output lines (22, 26) are provided with which the preceding voltage drop can be tapped from the collector of the output transistor (T2) and the collector of the further transistor (T3).

4 Claims, 1 Drawing Sheet

CIRCUIT ARRANGEMENT FOR CONVERTING A VOLTAGE DROP TAPPED FROM A TEST OBJECT FROM A PREDETERMINED INPUT VOLTAGE RANGE TO A DESIRED OUTPUT VOLTAGE RANGE

The invention relates to a circuit arrangement for converting a voltage drop tapped from a test object from a predetermined input voltage range to a desired output voltage range.

Cases exist of electrical circuits in which a component is tested for its functionality in that a voltage drop occurring across said component is measured and thereupon investigated to determine whether it lies within a predetermined tolerance range. Such a test object may for example be a switch which in perfect state in the ideal case has a contact resistance of a few mΩ when it is closed. If however the switch has a greater resistance in the closed state a voltage drop occurs at the switch by the evaluation of which it can be determined whether the switch can still be used or has to be replaced by a new switch. The switch could for example be employed in alarm initiating electronics in which closure of said switch activates an alarm. A switch no longer functionable due to corroded contacts would prevent activation of the alarm and this might possibly have very disadvantageous consequences. For this reason it is necessary from time to time to check the contact resistance of the closed contact.

However, when evaluating such a voltage drop a problem is encountered when the voltage drop lies at a voltage level which is higher than the input voltage range which can be applied to the evaluating circuit for the voltage drop. If for example a digital evaluating circuit with a voltage range of 0 to 5 V is used then it is not possible to apply a voltage drop lying for example at a voltage level of 15 V to the input of the evaluating circuit.

The invention is therefore based on the problem of providing a circuit arrangement of the type mentioned at the beginning with the aid of which it is possible to evaluate a voltage drop at a test object which lies at the test object at a voltage level which is outside the admissible input voltage range of an evaluating circuit for the voltage drop.

According to the invention this problem is solved by a current mirror circuit which is fed by a constant current source and comprises an input transistor and an output transistor, the constant current source lying in the collector line of the input transistor whilst in the collector line of the output transistor at least one diode lies which is traversed by a current having a value which is equal to the value of the current supplied by the constant current source, an identically configured circuit branch which lies parallel to the branch of the current mirror circuit containing the output transistor and the at least one diode and comprises a further transistor and at least one diode lying in the collector line thereof, the test object lying in the emitter line of the further transistor and being traversed by a test current from a further constant current source, and two output lines for emitting the converted voltage drop, one of which is connected to the collector of the output transistor and the other to the collector of the further transistor.

In the circuit arrangement according to the invention the voltage drop tapped from the test object is "mirrored" into an output voltage range which can be so defined that it is compatible with the input voltage range of an evaluating circuit. The converted voltage drop is independent of the voltage level at which it is originally generated at the test object. The circuit arrangement according to the invention can be made completely as an integrated circuit, the individual transistors and diodes being given respective identical parameters in pairs in the production so that they accordingly also have identical temperature behaviour. The conversion of the voltage drop is thus very exact without influences of temperature changes.

Advantageous further developments of the invention are characterized in the subsidiary claims.

The invention will now be explained by way of example with the aid of the drawing, the single FIGURE 1 of which shows a circuit diagram of the circuit arrangement according to the invention.

The circuit arrangement illustrated in FIGURE 1 includes a current mirror circuit comprising two PNP transistors T1 and T2. As can be seen, in the transistor T1 the collector terminal is connected to the base terminal, the base terminal in turn being connected to the base terminal of the transistor T2. The emitter terminals of the two transistors are connected to a supply voltage line 10 to which via a terminal 12 a supply voltage $U_v$ is applied. Depending on the use, the supply voltage may have very different values.

The current I1 impressed with the aid of a constant current source 14 lying in the collector line of the transistor T1 flows through the transistor T1 forming the input transistor of the current mirror circuit. Due to the known function of the current mirror circuit the current flowing in the collector line of the transistor T2 forming the output transistor of the current mirror circuit has the same value as the current I1.

As is apparent from the circuit diagram, in the collector line of the transistor T2 there is a diode D1 which is formed corresponding to the circuit diagram by a transistor with its base terminal connected directly to the collector terminal.

Parallel to the series circuit of the transistor T2 and the diode D1 there is a circuit branch which consists of a transistor T3 and a further diode D2 likewise connected in series therewith, a test object 16 consisting of a switch 18 being inserted into the emitter line of said transistor T3. The switch 18 is shown in the closed state which means that in the emitter line of the transistor T3 only the contact resistance of the switch 18 is effective. The current furnished by a further constant current source 20 flows via the switch 18. The circuit arrangement comprises a first output line 22 which connects the connection point between the collector terminal of the transistor T2 to an output terminal 24. A further output line 26 connects the connection point between the collector terminal of the transistor T3 and the diode D2 to an output terminal 28. The voltage drop converted with the aid of the circuit arrangement described can be tapped off between the output terminals 24 and 28.

In operation the circuit arrangement described behaves as follows:

As already mentioned, by the current mirror circuit having the two transistors T1 and T2 a constant current I2 is generated in the collector line of the transistor T2, the value of which corresponds to the current I1 impressed by the constant current source 14. Said current I2 flows through the diode D1 and generates at said diode a voltage drop $U_{BE}$. Said voltage drop of course changes nonlinearly in dependence upon the current flowing through the diode. Since however as explained above this current is constant, at the collector terminal of the transistor T2 and thus at the output terminal 24 a constant voltage occurs which corresponds exactly to the voltage drop $U_{BE}$ at the diode D1.

If it is assumed that the switch 18 in the test object 16 has the ideal contact resistance 0 Ohm, then the same current will flow through the emitter-collector path of the transistor T3 and the diode D2 as flows through the series circuit of the transistor T2 and diode D1 parallel thereto. This current also results in the voltage drop $U_{BE}$ at the diode D2 so that at the output terminal 28 the same voltage $U_{BE}$ as at the output 24 is present. The difference of the voltages at the two output terminals 24 and 28 is therefore zero. This corresponds exactly to the case where the voltage drop at the test object 16 has the value 0 V.

In practice however, even in the closed state the switch 18 will always have a certain low resistance so that in dependence upon the current introduced by means of the constant current source 20 a certain voltage drop will occur at the switch 18. As long as the switch 18 is functionable, its contact resistance will be very small and consequently the voltage drop will also be small and of the mV order of magnitude. Which specific contact resistance may still be considered low enough depends on the specific use of the switch 18.

The voltage drop occurring at the switch 18 leads T3 to a change in the base-emitter voltage at the transistor T3 and this in turn leads to the current flowing through the emitter-collector path of the transistor T3 being changed. This current change also leads to the voltage $U_{BE}$, formed as a voltage drop at the diode D2 changing in accordance with the well-known law expressed by the well-known diode equation. Just as the change of the base-emitter voltage of the transistor T3 leads to a change of the current flowing through the transistor T3, the current change through the diode D2 leads to a change of the voltage $U_{BE}'$ corresponding to the voltage drop at the switch 18. Thus, at the output terminals 24 and 28 an output voltage can be tapped which corresponds to the difference between the voltage $U_{BE}$ at the diode D1 and the voltage $U_{BE}'$ which is changed by the changed current through the diode D2 and represents exactly the voltage drop at the switch 18. If the voltage drop at the switch 18 is written $\Delta U$ and the output voltage between the terminals 24 and 28 represented $U_A$, then:

$$U_A = U_{BE} - U_{BE} = U_{BE} - (U_{BE} - \Delta U) = \Delta U$$

As is apparent from the mode of operation of the circuit arrangement shown in the drawing which is explained above, the level of the output voltage $U_A$ is completely independent of the supply voltage $U_v$ so that even on fluctuations of the supply voltage $U_v$ the voltage drop at the switch 18 can be generated at the output terminals 24 and 28 at the desired low output level.

If it is desired to increase the voltage drop, this can be achieved simply by connecting the diodes D1 and D2 in series with respective further diodes D3, D4 shown only schematically in the drawing. If, for example, two diodes connected in series are inserted into the collector lines of the transistors T2 and T3, then at each of the diodes in the collector line of the transistor T3 due to the voltage drop at the switch 18 the same change of the voltage $U_{BE}$ occurs and consequently at each diode the modified voltage $U_{BE}'$ is present and as a result the voltage tapped from the output terminals 24, 28 corresponds to twice the voltage drop at the switch 18.

The circuit described can readily be made in the form of an integrated circuit because it is made up solely of transistors and diodes. If it is ensured during production that the transistor T2 and the transistor T3 on the one hand and the diode D1 and the diode D2 on the other have exactly the same characteristic parameters, a circuit independent of changes in temperature is achieved because the parameters of said components change in the same manner upon temperature changes. As a result, both the voltage $U_{BE}$ at the diode D1 used as a reference voltage and the changed voltage $U_{BE}'$ at the diode D2 change in the same sense and thus have no effect on the voltage $U_A$ tapped from the output terminals 24 and 28.

I claim:

1. A circuit for converting a voltage drop tapped from a test object from a predetermined input voltage range to a desired output voltage range, said circuit comprising:

a current mirror circuit having an input transistor and an output transistor;

a first constant current source connected to the input of said current mirror circuit via said input transistor for providing a constant current thereto;

a first diode connected to the output of said current mirror circuit via said output transistor for receiving a current therefrom of equal magnitude to the current provided by said first constant current source to the input of said current mirror circuit;

said first diode and the output transistor of said current mirror circuit defining a first circuit branch;

a second circuit branch of identical configuration to the first circuit branch and lying parallel thereto, said second circuit branch including a third transistor and a second diode connected to the output of said third transistor;

a second constant current source connected to the input of said third transistor for providing a test current thereto;

a supply voltage terminal connected to said current mirror circuit;

the test object being adapted to be connected to the supply voltage terminal and between said second constant current source and the input of said third transistor to be traversed by the test current from said second constant current source;

a first output terminal connected between the output of said current mirror circuit and said first diode; and a second output terminal connected between the output of said third transistor and said second diode whereby a converted voltage drop is obtainable from said first and second output terminals in relation to the voltage drop as tapped from the test object.

2. A circuit as set forth in claim 1 wherein said input transistor and said output transistor of said current mirror circuit respectively include base, collector and emitter electrodes;

said first constant current source being connected to the collector of said input transistor and said first diode being connected to the collector of said output transistor;

said third transistor having base, collector and emitter electrodes;

said second diode being connected to the collector of said third transistor;

the test object being adapted to be connected to the emitter of said third transistor;

said first output terminal being connected between the collector of the output transistor of said current mirror circuit and said first diode; and said second output terminal being connected between the collector of said third transistor and said second diode.

3. A circuit as set forth in claim 1 wherein said first and second circuit branches respectively include a plurality of diodes connected in series to the collector of the output transistor of said current mirror circuit and the collector of said third transistor respectively.

4. A circuit as set forth in claim 1 wherein each of said diodes respectively comprises a transistor having base, collector and emitter electrodes in which the base and collector electrodes are connected together.

* * * * *